United States Patent
Shibata et al.

(10) Patent No.: US 6,935,351 B2
(45) Date of Patent: Aug. 30, 2005

(54) METHOD OF CLEANING CVD DEVICE AND CLEANING DEVICE THEREFOR

(75) Inventors: Koji Shibata, Kyoto (JP); Naoto Tsuji, Kyoto (JP); Hitoshi Murata, Kyoto (JP); Etsuo Wani, Kyoto (JP); Yoshihide Kosano, Kyoto (JP)

(73) Assignees: Anelva Corporation, Tokyo (JP); Ulvac, Inc., Chigasaki (JP); Kanto Denka Kogyo Co., Ltd., Tokyo (JP); Sanyo Electric Co., Ltd., Moriguchi (JP); Sony Corporation, Tokyo (JP); Daikin Industries, Ltd., Osaka (JP); Tokyo Electron Limited, Tokyo (JP); NEC Electronics Corporation, Kawasaki (JP); Hitachi Kokusai Electric Inc., Tokyo (JP); Matsushita Electric Industrial Co., Ltd., Kadoma (JP); Mitsubishi Denki Kabushiki Kaisha, Tokyo (JP); Renesas Technology Corp., Tokyo (JP)

( * ) Notice: Subject to any disclaimer, the term of this patent is extended or adjusted under 35 U.S.C. 154(b) by 255 days.

(21) Appl. No.: 10/276,305

(22) PCT Filed: Mar. 18, 2002

(86) PCT No.: PCT/JP02/02548
§ 371 (c)(1),
(2), (4) Date: Nov. 22, 2002

(87) PCT Pub. No.: WO02/078073
PCT Pub. Date: Oct. 3, 2002

(65) Prior Publication Data
US 2003/0079757 A1 May 1, 2003

(30) Foreign Application Priority Data
Mar. 22, 2001 (JP) .......................................... 2001-82840

(51) Int. Cl.[7] ................................................ B08B 9/00
(52) U.S. Cl. ........................ 134/22.1; 134/1.1; 134/902; 134/31; 134/36; 438/905; 156/345.35; 156/345.47

(58) Field of Search ................................. 134/1.1, 22.1, 134/902, 1, 31, 36; 438/905; 156/345.35, 345.47, 345.29, 345.43, 345.44

(56) References Cited

U.S. PATENT DOCUMENTS

| 4,910,042 A | 3/1990 | Hokynar |
| 5,647,945 A | 7/1997 | Matsuse et al. |
| 5,935,340 A | 8/1999 | Xia et al. |
| 6,274,058 B1 * | 8/2001 | Rajagopalan et al. .......... 216/67 |
| 2002/0011210 A1 * | 1/2002 | Satoh et al. ................. 118/715 |
| 2002/0020429 A1 * | 2/2002 | Selbrede et al. .............. 134/1.1 |

FOREIGN PATENT DOCUMENTS

| EP | 0 697 467 | 2/1996 |
| EP | 0 837 155 | 4/1998 |
| EP | 1 079 000 | 2/2001 |
| JP | 07-335563 | 12/1995 |
| JP | 2001-020076 | 1/2001 |
| WO | WO 02/12587 | 2/2002 |

* cited by examiner

Primary Examiner—M. Kornakov
(74) Attorney, Agent, or Firm—Oblon, Spivak, McClelland, Maier & Neustadt, P.C.

(57) ABSTRACT

A cleaning method for CVD apparatus wherein by-products such as $SiO_2$ and $Si_3N_4$ adhered to and deposited on surfaces of the inner wall, electrodes and other parts of a reaction chamber at the stage of film formation can be removed efficiently. Furthermore, the amount of cleaning gas discharged is so small that the influence on environment such as global warming is little and cost reduction can be also attained. After the film formation on a base material surface by the use of CVD apparatus, a fluorinated cleaning gas containing a fluorcompound is converted to plasma by means of a remote plasma generator, and the cleaning gas having been converted to plasma is introduced into a reaction chamber so that any by-products adhered to inner parts of the reaction chamber is removed.

14 Claims, 8 Drawing Sheets

METHOD OF CLEANING CVD DEVICE AND CLEANING DEVICE THEREFOR

TECHNICAL FIELD

The present invention relates to a method of cleaning a CVD (chemical vapor deposition) apparatus to thereby remove by-products adhered to, for example, the inner wall of a reaction chamber of CVD apparatus after the operation of thin-film formation, wherein the CVD apparatus is used to form a homogeneous thin film of high quality constituted of, for example, silicon oxide ($SiO_2$) or silicon nitride (e.g., $Si_3N_4$) on a surface of a base material for semiconductor such as a silicon wafer. The present invention also relates to a cleaning device employed for cleaning the CVD apparatus in this method.

BACKGROUND ART

The thin film of, for example, silicon oxide ($SiO_2$) or silicon nitride (e.g., $Si_3N_4$) is widely used in semiconductor elements such as a thin-film transistor, photoelectric transduction elements, etc. Mainly, the following three techniques are employed for forming the thin film of, for example, silicon oxide or silicon nitride:

(1) physical vapor-phase film forming technique such as sputtering or vacuum vapor deposition, which is a method wherein a solid thin film material is converted to atoms or atomic groups by physical means and deposited on a surface for film formation to thereby form a thin film;

(2) thermal CVD technique, which is a method wherein a gaseous thin film material is heated to high temperature so as to induce chemical reaction, thereby forming a thin film; and (3) plasma CVD technique, which is a method wherein a gaseous thin film material is converted to plasma so as to induce chemical reaction, thereby forming a thin film.

In particular, the plasma CVD (plasma enhanced chemical vapor deposition) technique (3) enables efficiently forming a dense uniform thin film, so that it is now widely employed.

The plasma CVD apparatus 100 for use in this plasma CVD technique generally has the structure of FIG. 5.

Specifically, the plasma CVD apparatus 100 includes reaction chamber 102 in which a decompression state is maintained. The reaction chamber 102 in its interior is provided with upper electrode 104 and lower electrode 106 arranged opposite to each other with a given spacing. Raw-material gas supply path 108 connected to a raw-material gas source (not shown) is connected to the upper electrode 104 so that raw-material gas is fed into the reaction chamber 102 through the upper electrode 104.

Further, high frequency applicator 110 for applying high frequency power is connected to the reaction chamber 102 at the vicinity of the upper electrode 104. Moreover, exhaust-gas path 114 for discharging exhaust gas through pump 112 is connected to the reaction chamber 102.

In the use of the thus constructed plasma CVD apparatus 100, for example, where a thin film of silicon oxide ($SiO_2$) is formed, monosilane ($SiH_4$), $N_2O$, $N_2$, $O_2$, Ar, etc. are introduced into the reaction chamber 102 in which a decompression of, for example, 130 Pa is maintained, through the raw-material gas supply path 108 and the upper electrode 104. In this plasma CVD apparatus 100, for example, where a thin film of silicon nitride (e.g., $Si_3N_4$) is formed, monosilane ($SiH_4$), $NH_3$, $N_2$, $O_2$, Ar, etc. are mainly introduced into the reaction chamber 102. During the introduction, a high frequency power of, for example, 13.56 MHz is applied between the upper and lower electrodes 104, 106 arranged opposite to each other in the reaction chamber 102 by means of the high frequency applicator 110. As a result, a high frequency electric field is generated, and, electron is impacted with neutral molecules of raw-material gas so that a high frequency plasma is generated in the electric field. In the high frequency plasma, the raw-material gas is dissociated into ions and radicals. The plasma CVD apparatus is so constructed that, by virtue of the reaction between ions and/or radicals and other materials, a thin film of silicon compounds is formed on a surface of semiconductor article W such as a silicon wafer disposed on one of the electrodes (lower electrode 106).

In this plasma CVD apparatus 100, at the stage of film formation, electric discharge within the reaction chamber 102 would cause a thin film material such as $SiO_2$ or $Si_3N_4$ to adhere to and deposit on surfaces other than the surface of semiconductor article W on which film formation is to be conducted, for example, those of the inner wall of reaction chamber 102 and the electrodes, so that by-products would occur. When such by-products grow to a certain thickness, the by-products would be detached by the self weight thereof or a stress caused thereby. The detachment of by-products, at the time of film formation, would cause mixing of fine particles as foreign matter into semiconductor products and hence contamination of the semiconductor products. Therefore, this plasma CVD apparatus 100 cannot produce a thin film of high quality and has had the danger of causing breakage of semiconductor circuits or shortcircuiting thereof and also causing, for example, yield drop.

Accordingly, with respect to the plasma CVD apparatus 100, it is common practice to remove by-products with the use of a cleaning gas of, for example, a fluorocompound such as $CF_4$, $C_2F_6$ or $NF_3$ optionally loaded with $O_2$, etc. after the completion of film formation so that the above by-products can be drawn off on occasion.

That is to say, in the method of cleaning by means of the conventional plasma CVD apparatus 100 using the above cleaning gas, as shown in FIG. 5, a cleaning gas consisting of a fluorocompound such as $CF_4$, $C_2F_6$ or $NF_3$, entrained by a gas of, for example, $O_2$ and/or Ar, in place of the raw-material gas at film formation is introduced into the reaction chamber 102 in which a decompression state is maintained, through the raw-material gas supply path 108 and the upper electrode 104, after the completion of film formation step. In the same manner as in the stage of film formation, a high frequency power is applied between the upper and lower electrodes 104, 106 arranged opposite to each other in the reaction chamber 102 by means of the high frequency applicator 110. As a result, a high frequency electric field is generated, and electron is impacted with neutral molecules of cleaning gas so that a high frequency plasma is generated in the electric field. In the high frequency plasma, the cleaning gas is dissociated into ions and radicals. The resultant ions and radicals react with by-products such as $SiO_2$ and $Si_3N_4$ adhered to and deposited on surfaces of the inner wall, electrodes and other parts of the reaction chamber 102, so that the by-products are gasified into $SiF_4$. The gasified product together with exhaust gas is discharged outside the reaction chamber 102 through the exhaust path 114 by means of the pump 112.

However, the above fluorocompound such as $CF_4$, $C_2F_6$ or $NF_3$ used as the cleaning gas is a stable compound having a long life in the atmospheric air, and hence has a drawback in that to make the disposal of waste gas after the cleaning harmless is difficult, so that disposal cost is unfavorably increasing. Further, as the global warming factors (value for a cumulative period of 100 years) of $CF_4$, $C_2F_6$, $SF_6$ and $NF_3$ are 6500, 9200, 23900 and 8000, respectively, they are extremely large. Therefore, the adverse influence thereof on environment is apprehended.

Namely, the conventional cleaning method for plasma CVD apparatus wherein the cleaning gas is introduced into the reaction chamber 102 in which a decompression state is maintained, through the raw-material gas supply path 108 and the upper electrode 104 and the cleaning gas is converted to plasma between the upper and lower electrodes 104, 106, is known as the "parallel plate type plasma CVD cleaning method". In this method, the ratio of gas discharged outside the reaction chamber 102 through the exhaust path 114 as shown in FIG. 5 is so high that, currently, it has an adverse influence on global warming and also both the dissociation efficiency and cleaning capacity are low.

As a countermeasure, there has been proposed a cleaning method wherein, as shown in FIG. 6, $NF_3$ is used as a cleaning gas and $NF_3$ is introduced into remote plasma generator 101 disposed outside the reaction chamber 102. As a result, the $NF_3$ is converted to plasma, and the cleaning gas of $NF_3$ having been converted to plasma is introduced into the reaction chamber 102 in which a decompression state is maintained, through the raw-material gas supply path 108 and the upper electrode 104. Consequently, the surfaces of the inner wall, electrodes and other parts of the reaction chamber 102 are cleaned.

However, this $NF_3$ gas has high toxicity, the influence on an environment is large and moreover it is expensive, so that cost of a semiconductor product is unfavoraable increased.

Under these circumstances, it is an object of the present invention to provide a cleaning method for CVD apparatus wherein the by-products such as $SiO_2$ and $Si_3N_4$ adhered to and deposited on surfaces of the inner wall, electrodes and other parts of the reaction chamber at the stage of film formation can be removed efficiently, and wherein the discharge amount of cleaning gas is so small, the influence on environment such as global warming is little, and also cost reduction can be attained. Another object of the present invention is to provide a cleaning device for CVD apparatus used in such a method.

DISCLOSURE OF THE INVENTION

The present invention has been made with a view toward solving the above problems and attaining the above objects. According to one aspect of the present invention, there is provided a method of cleaning a CVD apparatus wherein, a reactive gas is fed into a reaction chamber, a deposited film is formed on a surface of base material disposed in the reaction chamber, said method comprises:

converting a fluorinated cleaning gas containing a fluorcompound to plasma by means of a remote plasma generator after the deposited film formation on the base material surface by the use of the CVD apparatus, and introducing the cleaning gas having been converted to plasma into the reaction chamber to thereby remove any by-products sticking to inner parts of the reaction chamber.

According to another aspect of the present invention, there is provided a cleaning device for CVD apparatus, the CVD apparatus being a plasma CVD apparatus wherein a reactive gas is fed into a reaction chamber, a deposited film is formed on a surface of base material disposed in the reaction chamber, said cleaning device comprises:

a remote plasma generator capable of converting a fluorinated cleaning gas containing a fluorocompound to plasma after the deposited film formation on the base material surface by the use of the plasma CVD apparatus; and a cleaning gas introduction path for introducing the cleaning gas having been converted to plasma by means of the remote plasma generator into the reaction chamber, so that by-products adhered to inner parts of the reaction chamber are removed by the cleaning gas having been introduced into the reaction chamber.

As described above, a fluorinated cleaning gas containing a fluorocompound is converted to plasma by a remote plasma generator after the film formation and the cleaning gas having been converted to plasma is introduced into the reaction chamber, so that by-products adhered to inner parts of the reaction chamber is removed. Therefore, the dissociation efficiency of cleaning gas is so high that the by-products such as $SiO_2$ and $Si_3N_4$ adhered to and deposited on surfaces of the inner wall, electrodes and other parts of the reaction chamber can be removed efficiently. Moreover, by virtue of the construction, the discharge amount of cleaning gas is so small, the influence on environment such as global warming is little, and cost reduction can be also attained.

The cleaning method for CVD apparatus according to the present invention is preferably characterized in that the cleaning gas having been converted to plasma is directly introduced into the reaction chamber.

The cleaning device for CVD apparatus according to the present invention is preferably characterized in that the cleaning gas introduction path is so constructed as to directly introduce the cleaning gas having been converted to plasma into the reaction chamber.

By virtue of the construction, the cleaning gas having been converted to plasma by the remote plasma generator does not pass the raw material supply path, upper electrode, etc., so that the cleaning gas would not contact or impact with wall parts of such members. Therefore, the efficiency of gasifying the by-products into $SiF_4$ by reacting the cleaning as with by-products such as $SiO_2$, and $Si_3N_4$, which is adhered to and deposited on surfaces of the inner wall, electrodes and other parts of the reaction chamber, would be in no event lowered.

In the above construction, when the cleaning gas having been converted to plasma is directly introduced into the reaction chamber, it is desirable that a distance between the remote plasma generator and the reaction chamber is in the range of 0 to 200 cm.

Thus, by this regulation of the distance between the remote plasma generator and the reaction chamber, the lowering of the efficiency of gasifying the by-products into $SiF_4$ by reacting the cleaning gas with by-products such as $SiO_2$ and $Si_3N_4$ which is adhered to and deposited on surfaces of the inner wall, electrodes and other parts of the reaction chamber, would be effectively prevented.

Further, the cleaning method for CVD apparatus according to the present invention is preferably characterized in that, when the cleaning gas having been converted to plasma is directly introduced into the reaction chamber, the cleaning gas is introduced through a side part of the reaction chamber.

Moreover, the cleaning device for CVD apparatus according to the present invention is preferably characterized in that the cleaning gas introduction path is so constructed that when the cleaning gas having been converted to plasma is directly introduced into the reaction chamber, the cleaning gas is introduced through a side part of the reaction chamber.

By virtue of this construction, since the cleaning gas having been converted to plasma is introduced into the reaction chamber from a side part of the reaction chamber, the path for introducing the cleaning gas having been converted to plasma is short and the cleaning gas is directly fed to all over desired sites to be cleaned within the reaction chamber. Therefore, the efficiency of gasifying the by-products into $SiF_4$ by reacting the cleaning gas with by-products such as $SiO_2$ and $Si_3N_4$ which is adhered to and deposited on surfaces of the inner wall, electrodes and other parts of the reaction chamber can be improved.

It is preferred that a flow rate of the cleaning gas introduced into the reaction chamber is 0.1 to 100 L/min.

Therefore, by this regulation of the flow rate of cleaning gas introduced into the reaction chamber, the efficiency of gasifying the by-products into $SiF_4$ by reacting the cleaning gas with by-products such as $SiO_2$ and $Si_3N_4$, which is adhered to and deposited on surfaces of the inner wall, electrodes and other parts of the reaction chamber, would be improved.

It is also preferred in the present invention that the pressure of cleaning gas in the reaction chamber is in the range of 10 to 2000 Pa.

Therefore, by this regulation of the flow rate of cleaning gas introduced into the reaction chamber, the efficiency of gasifying the by-products into $SiF_4$ by reacting the cleaning gas with by-products such as $SiO_2$ and $Si_3N_4$, which is adhered to and deposited on surfaces of the inner wall, electrodes and other parts of the reaction chamber, would be improved.

Still further, preferably, the cleaning method for CVD apparatus according to the present invention is characterized in that:

the cleaning gas having been converted to plasma is directly introduced into the reaction chamber, and the cleaning gas having been converted to plasma is also introduced into the reaction chamber through a raw-material gas supply path.

Furthermore, preferably, the cleaning device for CVD apparatus according to the present invention is characterized in that the cleaning gas introduction path includes:

a first cleaning gas introduction path for directly introducing the cleaning gas having been converted to plasma into the reaction chamber, and a second cleaning gas introduction path for introducing the cleaning gas having been converted to plasma into the reaction chamber through a raw-material gas supply path.

Therefore, in this construction, the cleaning gas having been converted to plasma is introduced directly into the reaction chamber and the cleaning gas is introduced into the reaction chamber through a raw-material gas supply path. As a result, the efficiency of gasifying the by-products into $SifF_4$ by reacting the cleaning gas with by-products such as $SiO_2$ and $Si_3N_4$, which is adhered to and deposited on surfaces of the inner wall, electrodes and other parts of the reaction chamber, would be further improved.

Moreover, preferably, the cleaning method for CVD apparatus according to the present invention is characterized in that a selective switching is performed between the direct introduction of the cleaning gas having been converted to plasma into the reaction chamber and the introduction of the cleaning gas having been converted to plasma into the reaction chamber through the raw gas supply path.

Furthermore, preferably, the cleaning device for CVD apparatus according to the present invention is characterized in that it further comprises a switching controller capable of performing a selective switching between the first cleaning gas introduction path and the second cleaning gas introduction path.

Therefore, by this construction, the efficiency of gasifying by-products into $SiF_4$ by reacting the cleaning gas with by-products such as $SiO_2$ and $Si_3N_4$, which is adhered and deposited on surfaces of the inner wall, electrodes and other parts of the reaction chamber, would be further improved.

In the present invention, furthermore, it is preferred that the fluorocompound is at least one member selected from the group consisting of nitrogenous fluorocompounds, oxygen-containing perfluorocarbons and perfluorocarbons having 1 to 6 carbon atoms. Still preferably, the fluorocompound is a perfluorocarbon having 1 to 6 carbon atoms.

Herein, the terminology "perfluorocarbons" means compounds consisting of various functional groups and fluorinated carbon compounds, such as chain aliphatic, linear ether, cyclic ether and unsaturated (including diene) compounds and compounds containing oxygen in the molecules thereof.

When these fluorocompounds are used as the cleaning gas, the dissociation efficiency of cleaning gas is so high that the by-products such as $SiO_2$ and $Si_3N_4$ adhered to and deposited on surfaces of the inner wall, electrodes and other parts of the reaction chamber can be removed efficiently. Moreover, when these fluorocompounds are used as the cleaning gas, the discharge amount of cleaning gas is so small that the influence on environment such as global warming is little and cost reduction can be attained.

BEST MODE FOR CARRYING OUT THE INVENTION

Figure 1:
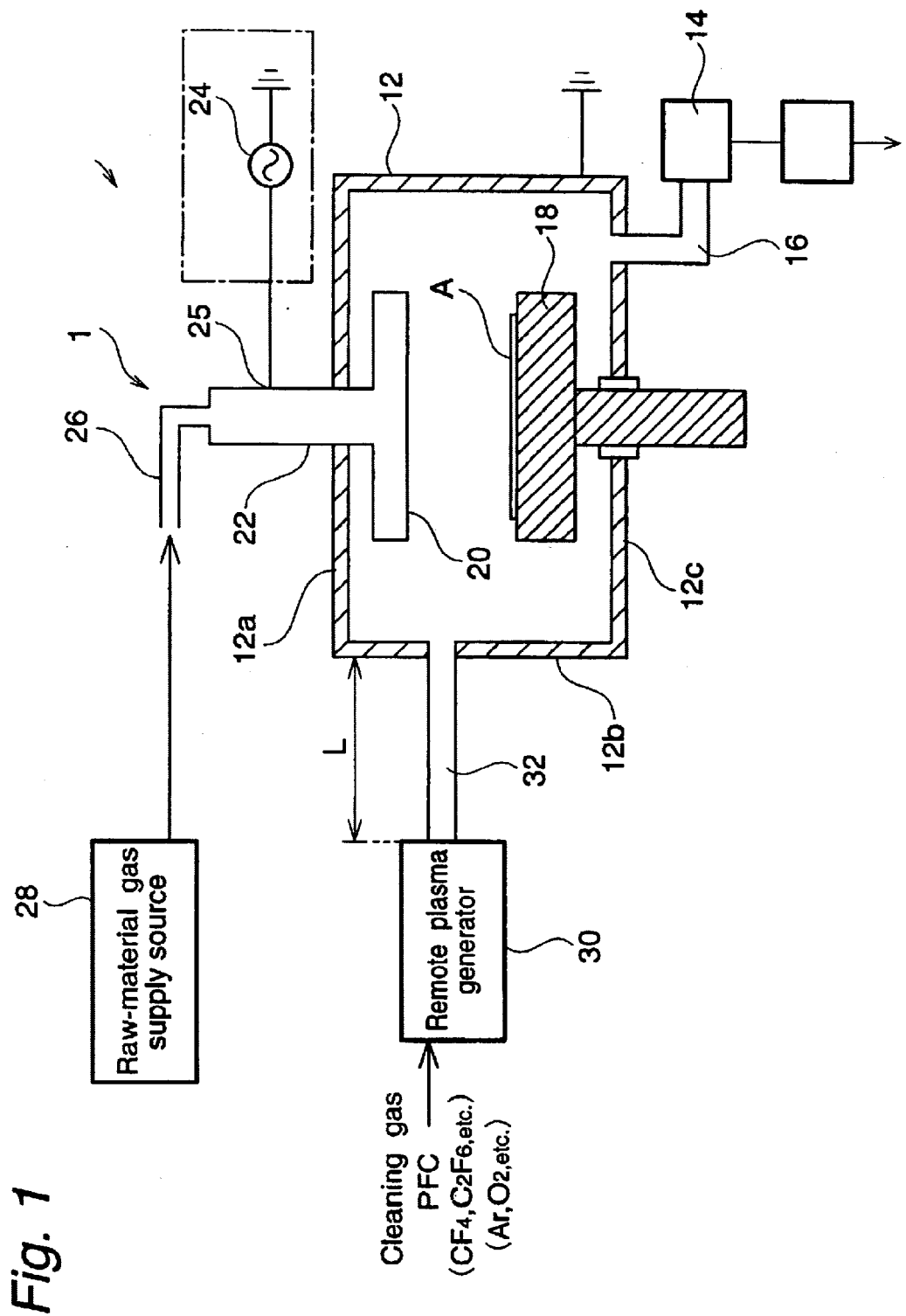
FIG. 1 is a schematic view showing the first embodiment wherein the cleaning device for CVD apparatus used in carrying out the cleaning method for CVD apparatus according to the present invention has been applied to a palsma CVD method.

Embodiments of the present invention (Examples) will be described below with reference to the appended drawings. FIG. 1 is a schematic view showing the first embodiment wherein the cleaning device for CVD apparatus used in carrying out the cleaning method for CVD apparatus according to the present invention has been applied to a plasma CVD method.

As shown in FIG. 1, cleaning device 11 for plasma CVD apparatus 10 includes reaction chamber 12 wherein a vacuum (reduced pressure) is maintained. The reaction chamber 12 at its bottom wall 12c is provided with exhaust path 16, through which the inside gas is discharged outside by means of pump 14. By virtue of this construction, a given vacuum (decompression state) is maintained inside the reaction chamber 12.

Further, the reaction chamber 12 in its interior is provided with lower electrode 18 which constitutes a stage for mounting base material A, such as silicon wafer, on which at an upper surface a silicon thin film is deposited (e.g., vapor deposited). The lower electrode 18 is passed through the bottom wall 12c of the reaction chamber 12 and is vertically slidable by means of driving means (not shown) As a result, the lower electrode 18 is capable of regulating its position. Slide portion between the lower electrode 18 and the bottom wall 12c is provided with a seal member such as a seal ring (not shown) so that a vacuum can be ensured inside the reaction chamber 12.

On the other hand, at an upper part of the reaction chamber 12, an upper electrode 20 is disposed. Base end portion 22 of the upper electrode 20 is passed through top wall 12a of the reaction chamber 12, and is connected to high frequency power source 24 disposed outside the reaction chamber 12. The upper electrode 20 is provided with high frequency applicator 25, such as a high frequency application coil (not shown). A matching circuit (not shown) is disposed between the high frequency applicator 25 and the high frequency power source 24. By virtue of this construction, high frequency power generated by the high frequency power source 24 can be propagated without any loss to the high frequency applicator 25, such as a high frequency application coil.

Further, the upper electrode 20 is provided with raw-material gas supply path 26. As a result, the raw-material gas from raw-material gas supply source 28 is introduced into the reaction chamber 12 in which a decompression state is maintained, through the raw-material gas supply path 26 and the upper electrode 20.

In addition, a remote plasma generator 30 capable of converting a fluorinated cleaning gas containing a fluoro-compound to plasma is provided with the side portion of the reaction chamber 12. Furthermore, the cleaning gas having been converted to plasma by the remote plasma generator 30 is introduced into the reaction chamber 12 from side wall 12b through connecting piping 32 constituting a gas introduction path.

The plasma CVD apparatus 10 of the above construction according to the present invention is operated in the following manner.

First, base material A, such as a silicon wafer, on which at an upper surface a silicon thin film is to be vapor deposited, is mounted on the stage of the lower electrode 18 of the reaction chamber 12. The distance between the base material A and the upper electrode 20 is regulated to predetermined distance by driving means (not shown).

Then, inside gas is discharged outside through the exhaust path 16 provided in the bottom wall 12c of the reaction chamber 12 by means of the pump 14. As a result, a given vacuum (decompression state) of, for example, 10 to 2000 Pa is maintained inside the reaction chamber 12.

Subsequently, the raw-material gas is introduced into the reaction chamber 12, in which a decompression state is maintained, from the raw-material gas supply source 28 through the raw-material gas supply path 26 and the upper electrode 20.

In this case, as for the raw-material gas fed from the raw-material gas supply source 28, for example, it is appropriate to feed monosilane ($SiH_4$), $N_2O$, $N_2$, $O_2$, Ar, etc., as raw-material gas, in the formation of a thin film of silicon oxide ($SiO_2$). On the other hand, in the formation of a thin film of silicon nitride (e.g., $Si_3N_4$), it is appropriate to feed monosilane ($SiH_4$), $NH_3$, $N_2$, $O_2$, Ar, etc. as raw-material gas. However, the raw-material gas is not limited to these and can be appropriately changed depending on the type of thin film to be formed or the like. For example, it can be appropriate to use disilane ($Si_2H_6$), TEOS (tetraethoxysilane: $Si(OC_2H_5)_4$), etc. as the raw-material gas with the use of, for example, $O_2$ or $O_3$ as a raw-material gas.

High frequency power outputted from the high frequency power source 24 is propagated to the high frequency applicator 25, such as a high frequency application coil, whereby the high frequency power is applied to the upper electrode 20. Thus, a high frequency electric field is generated by the upper electrode 20. In the electric field, electrons impact with neutral molecules of raw-material gas so that a high frequency plasma is generated. In the high frequency plasma, the raw-material gas is dissociated into ions and radicals. By virtue of the reaction between ions and/or radicals and other materials, a silicon thin film compound is formed on a surface of base material A such as silicon wafer mounted on the lower electrode 18.

In this plasma CVD apparatus 10, at the stage of film formation, electric discharge within the reaction chamber 12 would cause a thin film material such as $SiO_2$ or $Si_3N_4$ to adhere to and deposit on surfaces other than the surface of semiconductor article A on which film formation is to be conducted, for example, those of the inner wall and electrodes of the reaction chamber 12, so that by-products would occur. When such by-products grow to a certain thickness, the by-products would be detached and dissipated by the self weight thereof or a stress caused thereby. These, at the time of film formation, would cause mixing of fine particles as foreign matter into semiconductor products and hence contamination of the semiconductor products. Therefore, this plasma CVD apparatus 10 cannot produce a thin film of high quality and has had the danger of causing breakage of semiconductor circuits or shortcircuiting thereof and also causing, for example, yield drop.

Accordingly, in the cleaning device 11 for plasma CVD apparatus 10 according to the present invention, the fluorinated cleaning gas containing a fluorocompound is converted to plasma by means of the remote plasma generator 30. Then, the resultant cleaning gas is introduced into the reaction chamber 12 in which a decompression state is maintained, through the connecting piping 32.

In the remote plasma generator 30, a high frequency plasma is geneated, and, in the high frequency plasma, the cleaning gas is dissociated into ions and radicals. These ions and radicals react with by-products such as $SiO_2$ and $Si_3N_4$ adhered to and deposited on surfaces of the inner wall, electrodes and other parts of the reaction chamber 12 so that the by-products into $SiF_4$ is gasified. The resultant gas together with exhaust gas is discharged outside the reaction chamber 12 through the exhaust path 16 by means of the pump 14.

As the fluorinated cleaning gas containing a fluorocompound to be converted to plasma by means of the remote plasma generator 30, for example, perfluorocarbons having 1 to 6 carbon atoms including:

chain aliphatic perfluorocarbons such as $CF_4$, $C_2F_6$, $C_3F_8$, $C_4F_{10}$ and $C_5F_{12}$;

alicyclic perfluorocarbons such as $C_4F_8$, $C_5F_{10}$ and $C_6F_{12}$;

linear perfluoroethers such as $CF_3OCF_3$, $CF_3OC_2F_5$ and $C_2F_5OC_2F_5$;

cyclic perfluoroethers such as $C_3F_6O$, $C_4F_8O$ and $C_5F_{10}O$;

unsaturated perfluorocarbons such as $C_3F_6$, $C_4F_8$ and $C_5F_{10}$; and diene perfluorocarbons such as $C_4F_6$ and $C_5F_8$ can be used.

Further, as the fluorinated cleaning gas, oxygen-containing perfluorocarbons such as $COF_2$, $CF_3COF$ and $CF_3OF$; nitrogenous fluorocompounds such as FNO, $F_3NO$ and $FNO_2$; and, preferably, oxygen-containing nitrogenous fluorocompounds can be used.

These fluorocompounds may be those having at least one fluorine atom which result from partial replacement of the fluorine atoms by hydrogen atoms. In particular, the use of $CF_4$, $C_2F_6$ or $C_3F_8$ is preferred. The use of $CF_4$ or $C_2F_6$ is still preferred.

The above fluorocompounds can be used individually or in combination.

The cleaning gas containing a fluorocompound for use in the present invention can appropriately be used in combination with another gas as long as it is not detrimental to the effects exerted by the present invention. As such another gas, for example, He, Ne, Ar or $O_2$. The amount of other gas mixed with the fluorinated cleaning gas is not particularly limited, and can be determined taking into account, for example, the amount and thickness of by-products (deposits) adhered to the inner wall and other parts of the reaction chamber 12 of the CVD apparatus 10, the type of fluorocompound employed and the composition of by-products can be used.

As the target compounds to be removed by chamber cleaning using the above fluorocompounds, there can be mentioned deposits of silicic compounds adhered to, for example, CVD chamber walls and CVD apparatus jigs in the CVD method or the like. Examples of such silicic compound deposits include those of at least one member selected from among:

(1) compounds of silicon, (2) compounds of silicon and at least one member selected from among oxygen, nitrogen, fluorine and carbon, and (3) compounds of high-melting-point metal silicite. Specifically, for example, high-melting-point metal silicites of Si, $SiO_2$, $Si_3N_4$, WSi, etc. can be used.

From the viewpoint of the effect of cleaning for removing the by-products adhered to the inner wall of reaction chamber 12, it is preferred that the flow rate of cleaning gas introduced into the reaction chamber 12 is in the range of 0.1 to 100 L/min, preferably 0.5 to 10 L/min. The reason is that, when the flow rate of cleaning gas introduced into the reaction chamber 12 is less than 0.1 L/min, the above cleaning effect cannot be anticipated. On the other hand, when the flow rate is greater than 100 L/min, the amount of cleaning gas discharged outside without contributing to cleaning becomes unfavorably large.

The flow rate of cleaning gas introduced can be appropriately changed depending on, for example, the type and size of base material A such as a flat panel disk or the like. For instance, when the fluorocompound is $C_2F_6$, it is appropriate to set the flow rate for 0.5 to 5 L/min.

Further, from the viewpoint of the effect of cleaning for removing the by-products adhered to the inner wall of reaction chamber 12, it is preferred that the pressure of cleaning gas in the reaction chamber 12 is in the range of 10 to 2000 Pa, preferably 50 to 100 Pa. The reason is that, when the pressure of cleaning gas in the reaction chamber 12 is lower than 10 Pa or greater than 2000 Pa, the above cleaning effect cannot be anticipated. The pressure of cleaning gas in the reaction chamber 12 can be appropriately changed depending on, for example, the type and size of base material A such as a flat panel disk or the like. For instance, when the fluorocompound is $C_2F_6$, it is appropriate to set the pressure for 100 to 500 Pa.

Still further, it is preferred that the distance between the remote plasma generator 30 and the reaction chamber 12, namely, the length L of connecting piping 32 is in the range of 0 to 200 cm, preferably 0 to 100 cm, and still preferably 0 to 50 cm. The reason is that, when the length L is greater than 200 cm, the cleaning gas having been converted to plasma would contact and impact with wall portions of the connecting piping 32 with the result that the efficiency of gasifying the by-products would be lowered. The length L, although the smaller the better, can appropriately be determined depending on, for example, the type and size of base material A.

Although the material of connecting piping 32 is not particularly limited, it is preferred from the viewpoint of the effect of preventing the drop of gasification efficiency that the material is selected from among, for example, alumina, inactivated aluminum, a fluororesin and a metal coated with a fluororesin.

Figure 2:
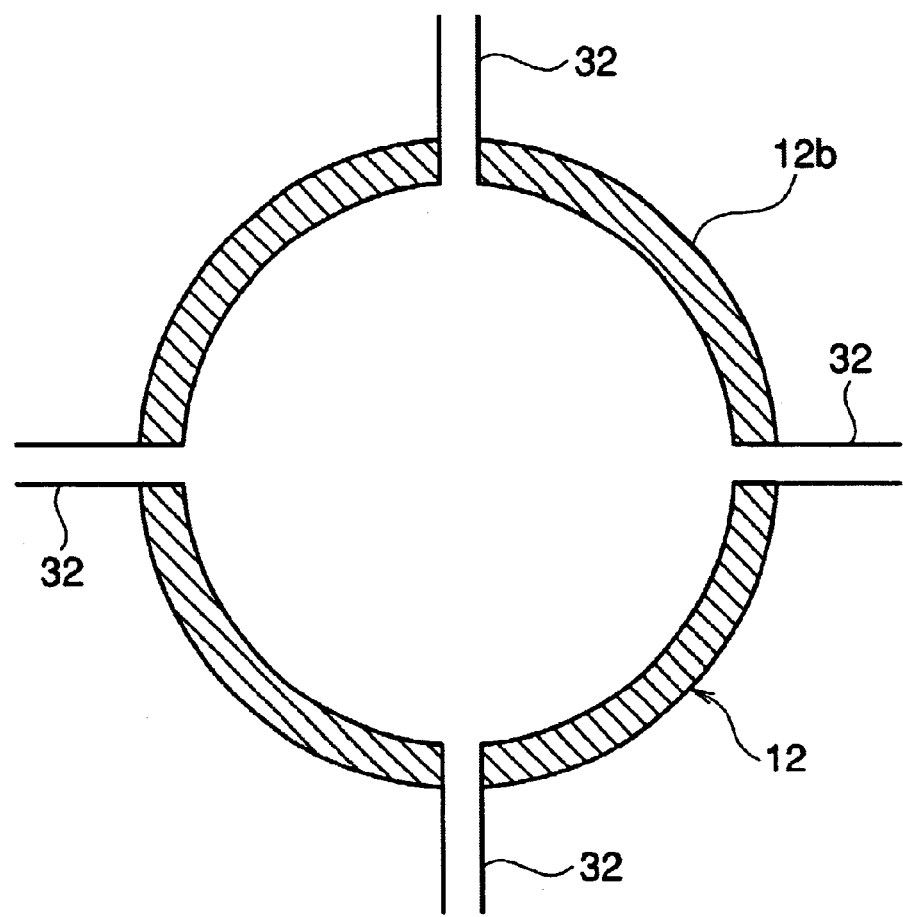
FIG. 2 is a partial enlarged sectional view of the cleaning device for CVD apparatus according to the present invention.
Figure 3:
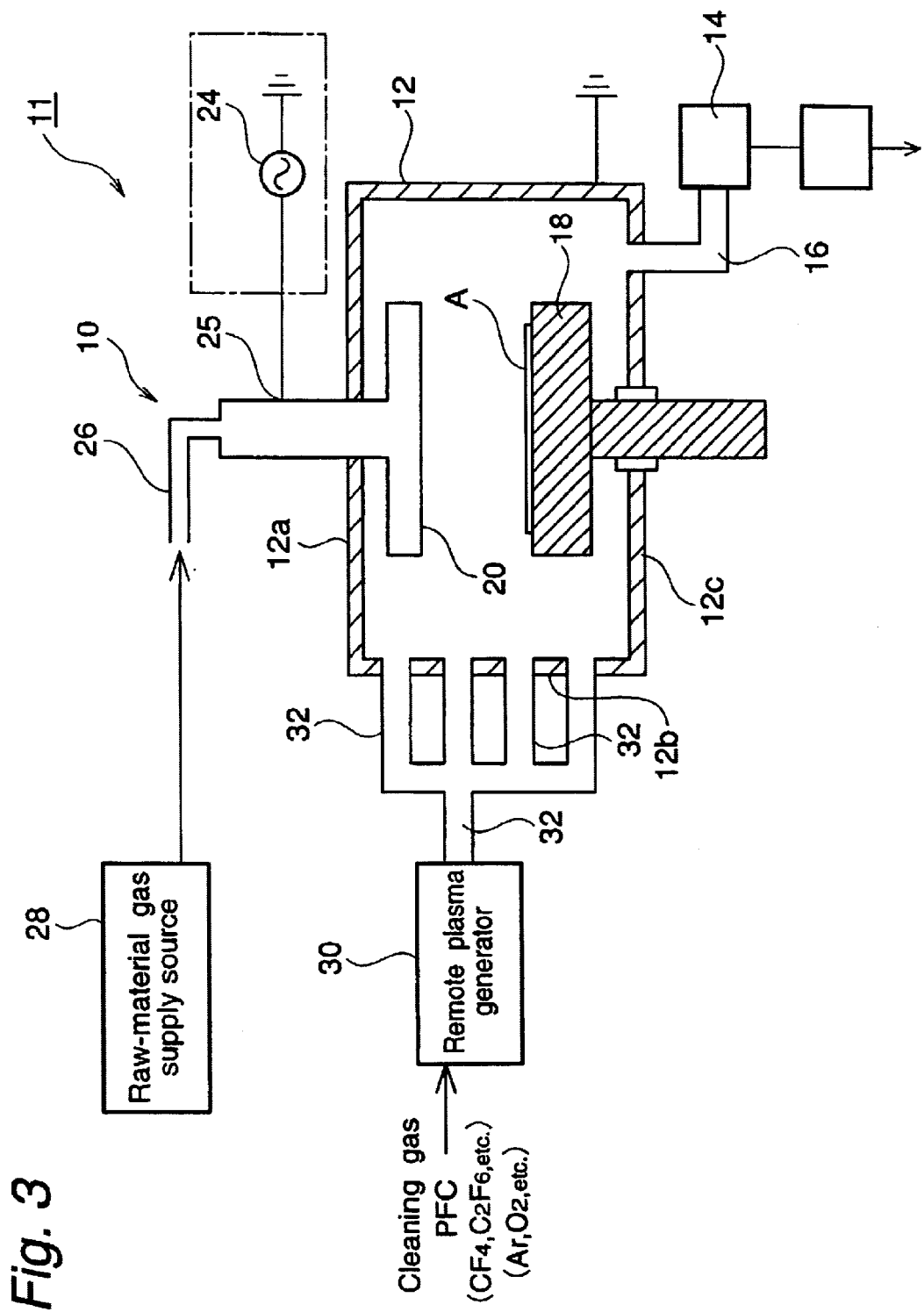
FIG. 3 is another partial enlarged sectional view of the cleaning device for CVD apparatus according to the present invention.

In this Embodiment, the remote plasma generator 30 and the reaction chamber 12 have been so arranged that the cleaning gas having been converted to plasma is passed through the connecting piping 32 and introduced into the reaction chamber 12 at the chamber side wall 12b. However, this arrangement is not limitative as long as the cleaning gas is directly introduced into the reaction chamber 12. For example, the cleaning gas can be introduced into the reaction chamber 12 at its top wall 12a or at its bottom wall 12c. Also, as shown in FIG. 2, it is appropriate to branch the connecting piping 32 into a plurality of pipes and effect even introduction around the chamber side wall 12b. Further, as shown in FIG. 3, the introduction into the reaction chamber 12 may be effected from positions of different heights of the chamber side wall 12b. Still further, although not shown, these may be combined.

Moreover, the remote plasma generator 30 is not particularly limited, and known remote plasma generators can be used. For example, "ASTRON" manufactured by ASTEX can be used.

The construction of this Embodiment of the present invention is such that, after the film formation, the fluorinated cleaning gas containing a fluorocompound is converted to plasma by the remote plasma generator 30 and thereafter the cleaning gas having been converted to plasma is introduced into the reaction chamber 12 so that by-products adhered to inner parts of the reaction chamber 12 are removed. Consequently, the dissociation efficiency of cleaning gas is so high that the by-products such as $SiO_2$ and $Si_3N_4$ adhered to and deposited on surfaces of the inner wall, electrodes and other parts of the reaction chamber 12 can be removed efficiently. Moreover, the discharge amount of cleaning gas is so small that the influence on environment such as global warming is little and cost reduction can be attained.

Figure 4:
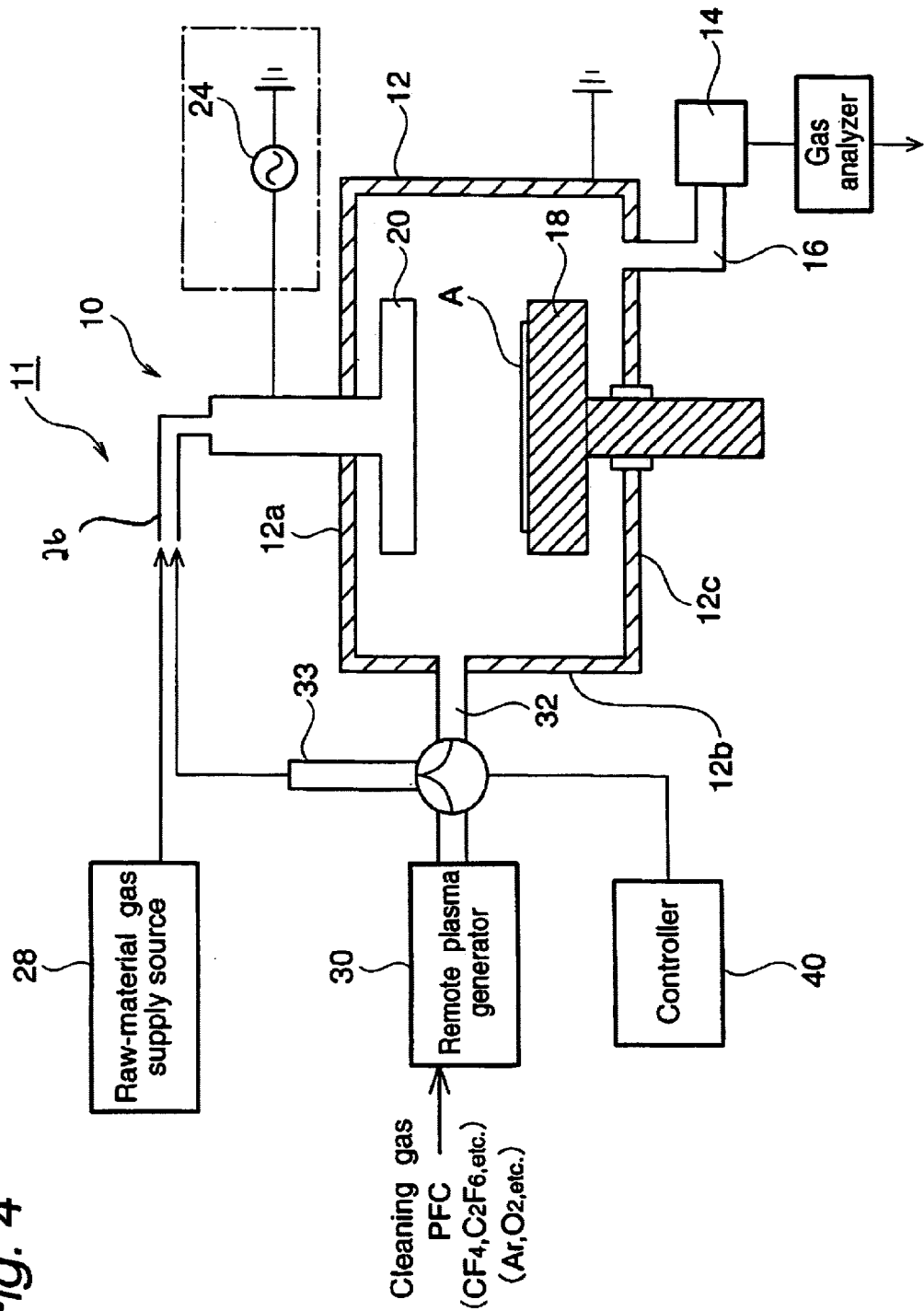
FIG. 4 is a schematic view showing the second embodiment wherein the cleaning device for CVD apparatus used in carrying out the cleaning method for CVD apparatus according to the present invention has been applied to a plasma CVD apparatus.

FIG. 4 is a schematic view showing the second embodiment wherein the cleaning device for CVD apparatus used in carrying out the cleaning method for CVD apparatus according to the present invention has been applied to a plasma CVD apparatus.

The cleaning device 11 for plasma CVD apparatus 10 according to this Embodiment has fundamentally the same construction as that of the cleaning device 11 for plasma CVD apparatus 10 shown in FIG. 1. Through FIGS. 1 and 4, like reference numbers are assigned to like constituent members, and detailed explanation thereof would not be repeated.

The cleaning device 11 for plasma CVD apparatus 10 according to this Embodiment is provided with connecting piping 32 which functions as a first cleaning gas introduction path adapted to directly introduce the cleaning gas having been converted to plasma by the remote plasma generator 30 into the reaction chamber 12 at its chamber side wall 12b. The cleaning device 11 is also provided with connecting piping 33 which functions as a second cleaning gas introduction path adapted to introduce the cleaning gas having been converted to plasma by the remote plasma generator 30 into the reaction chamber 12 through the raw-material gas supply path 26 and through the upper electrode 20.

This construction designed to directly introduce the cleaning gas having been converted to plasma into the reaction chamber 12 through the connecting piping 32 which functions as a first cleaning gas introduction path. This construction designed to effect the introduction into the reaction chamber 12 through the connecting piping 33 which functions as a second cleaning gas introduction path adapted to introduce the cleaning gas through the raw gas supply path 26 and the upper electrode 20. Therefore, the efficiency of gasifying the by-products into SiF4 by reacting the cleaning gas with by-products such as $SiO_2$ and $Si_3N_4$ adhered to and deposited on surfaces of the inner wall, electrodes and other parts of the reaction chamber 12.

In this Embodiment, as shown in FIG. 4, it is preferred that the cleaning device 11 further comprise switching controller 40 capable of performing a selective switching between the connecting piping 32 as the first cleaning gas introduction path and the connecting piping 33 as the second cleaning gas introduction path. This construction enables more effectively enhancing the efficiency of gasifying the by-products into $SiF_4$ by reacting with by-products such as $SiO_2$ and $Si_3N_4$ adhered to and deposited on surfaces of the inner wall, electrodes and other parts of the reaction chamber 12.

The above describes varied forms of cleaning device for plasma CVD apparatus according to the present invention. Within the scope of the present invention, for example, although the above Embodiments directed to the formation of silicon thin film, the above Embodiments are also applicable to the formation of other thin films such as silicon germanium (SiGe), silicon carbide (SiC), SiOF, SiON and carbonaceous $SiO_2$ films.

In the above Embodiments, although the horizontal apparatus is described, it is possible to substitute a vertical apparatus therefor. Further, in the above Embodiments, although the leaf type is described, application can also be effected to a batch type CVD apparatus.

Furthermore, although the above Embodiments describe one mode of application to the plasma CVD apparatus, the present invention can also be applied to other CVD methods, for example, the vacuum deposition method wherein a thin film is deposited on a base material through the thermal decomposition, oxidation, reduction, polymerization, vaporization reaction, etc. of a thin film material at high temperatures. As apparent from the above, various changes and modifications can be naturally made.

EXAMPLE 1

A base material (silicon substrate of 725 μm thickness and 200 mm diameter) was mounted on the lower electrode 18, using the CVD apparatus 10 of FIG. 1. As for raw-material reactive gas, specifically, monosilane gas 180 SCCM, ammonia 320 SCCM and $N_2$ 1 L/min were fed into the reaction chamber 12. The pressure inside the reaction chamber 12 was maintained at 320 Pa, and high frequency power of 520 W output from a 13.65 MHz high frequency power source was applied to the upper electrode 20. Under these conditions, film formation was performed for 40 sec so that a thin film of 7000 to 8000 Å was obtained.

After this film formation, the cleaning method of the present invention was carried out with the use of:

cleaning gas of 130 Pa pressure consisting of $CF_4/Ar/O_2$ (gas flow rates 200/1600/400 (SCCM)), and cleaning gas of 130 Pa pressure consisting of $C_2F_6/Ar/O_2$ (gas flow rates 100/1600/400 (SCCM)). The gas discharge amount and time required for chamber cleaning were measured by means of gas analyzer ("FTIR" manufactured by MIDAC) disposed downstream of the pump 14 as shown in FIG. 1.

Figure 6:
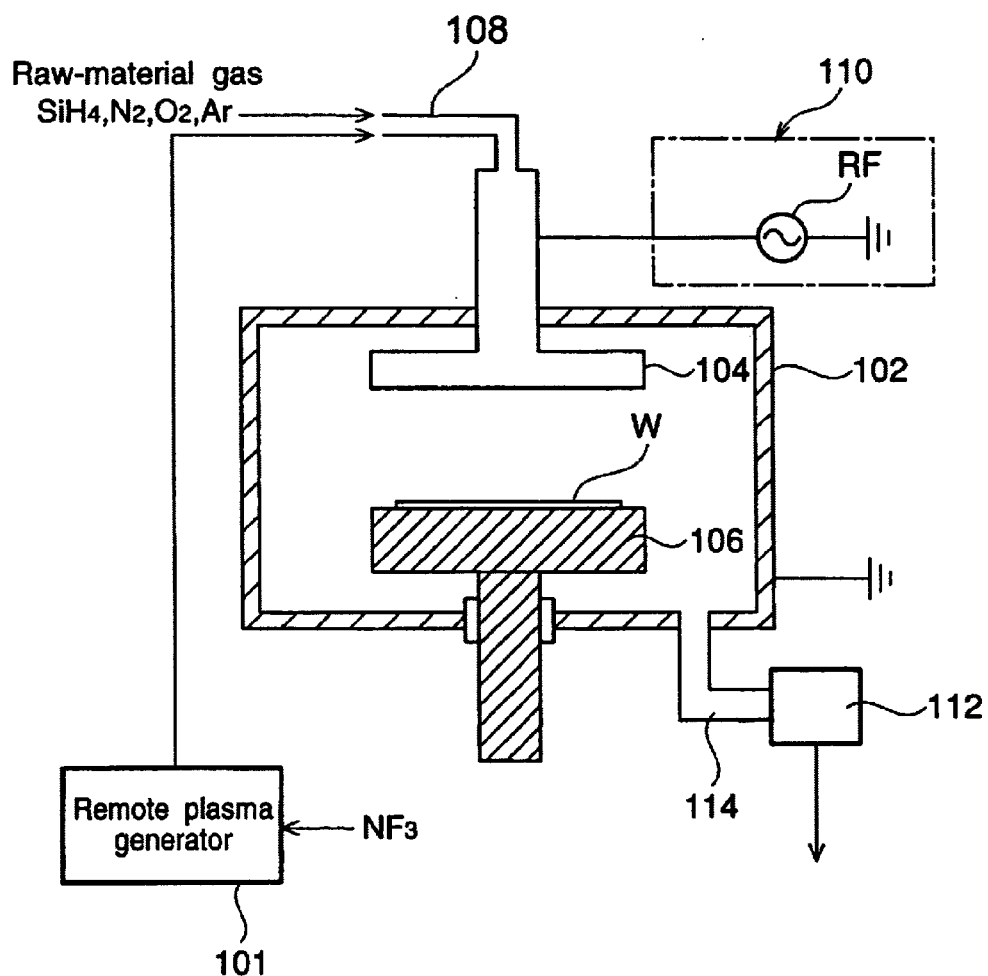
FIG. 6 is a schematic view of a cleaning device for plasma CVD apparatus used in the conventional plasma CVD method.

As a comparative example, cleaning according to the prior art was performed by, as shown in FIG. 6, cleaning gas of 260 Pa pressure consisting of $NF_3/Ar$ (gas flow rates 500/500 (SCCM)) is converted to plasma by means of the remote plasma generator 101. Then, the cleaning gas having been converted to plasma is introduced into the reaction chamber 102 in which a decompression state was maintained, through the gas supply path 108 and the upper electrode 104. The gas discharge amount and time required for chamber cleaning were measured in the above manner.

Figure 5:
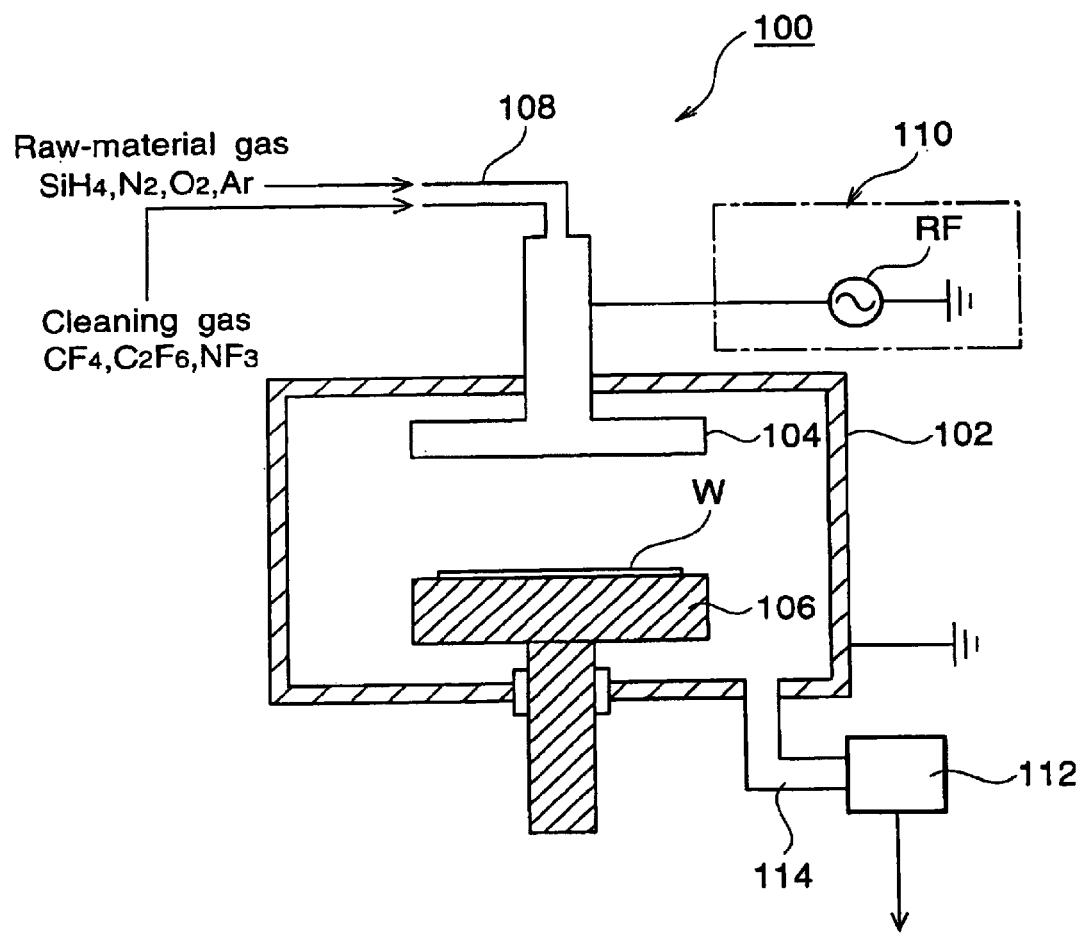
FIG. 5 is a schematic view of a plasma CVD apparatus for use in the conventional plasma CVD method.

As another comparative example, as shown in FIG. 5, the conventional parallel plate type plasma cleaning method was carried out, with use of:

cleaning gas of 200 Pa pressure consisting of $C_2F_6/O_2$ (gas flow rates 500/500 (SCCM)) with RF power of 500 W, and cleaning gas of 120 Pa pressure consisting of $NF_3/Ar$ (gas flow rates 270/500 (SCCM)) with RF power of 500 W. The gas discharge amount and time required for chamber cleaning were measured in the above manner. The results are listed in Table 1 below.

As apparent from the results of Table 1, in the conventional parallel plate type plasma cleaning method, the gas discharge amount is high, the gas discharge amount is high, and the efficiency of dissociation of cleaning gas, which contributes to intended cleaning, into ions and radicals is low.

By contrast, in the remote plasma type cleaning method according to the present invention, the gas discharge amount is low, the gas discharge amount is low, and the efficiency of dissociation of cleaning gas, which contributes to intended cleaning, into ions and radicals is high. With respect to the time required for chamber cleaning, there is no marked difference between the remote plasma type cleaning method according to the present invention and the conventional parallel plate type plasma cleaning method.

TABLE 1

Dependence of gas discharge amount on cleaning method

|  |  | Gas discharge amoumt (L/10 min) | | | Dissociation efficiency | Amt. of fluorocompound gas used | Gas discharge amount | Required time (sec) |
|---|---|---|---|---|---|---|---|---|
|  |  | $C_2F_6$ | $CF_4$ | $NF_3$ | (%) | (L/10 min) | (%) |  |
| remote type | $CF_4/Ar/O_2$ | — | 0.234 | — | 88.3 | 1.00 | 11.68 | 158 |
|  | $C_2F_6/Ar/O_2$ | 0.007 | 0.021 | — | 99.3 | 2.00 | 0.20 | 175 |
|  | $NF_3/Ar$ | — | — | 0.103 | 97.9 | 5.00 | 2.06 | 128 |
| parallel plate type | $C_2F_6/O2$ | 4.630 | 0.407 | — | 7.4 | 5.00 | 92.60 | 138 |
|  | $NF_3/Ar$ | — | — | 0.613 | 77.3 | 2.70 | 22.70 | 130 |

EXAMPLE 2

The cleaning method of the present invention was carried out with the use of cleaning gas consisting of $C_2F_6/Ar/O_2$ (gas flow rates 100/1600/400 (SCCM)) in the same manner as in Example 1, except that the cleaning pressure was varied within the range of 130 to 600 Pa, and the gas discharge amounts were measured. The results are shown in the graph of FIG. 7.

Figure 7:
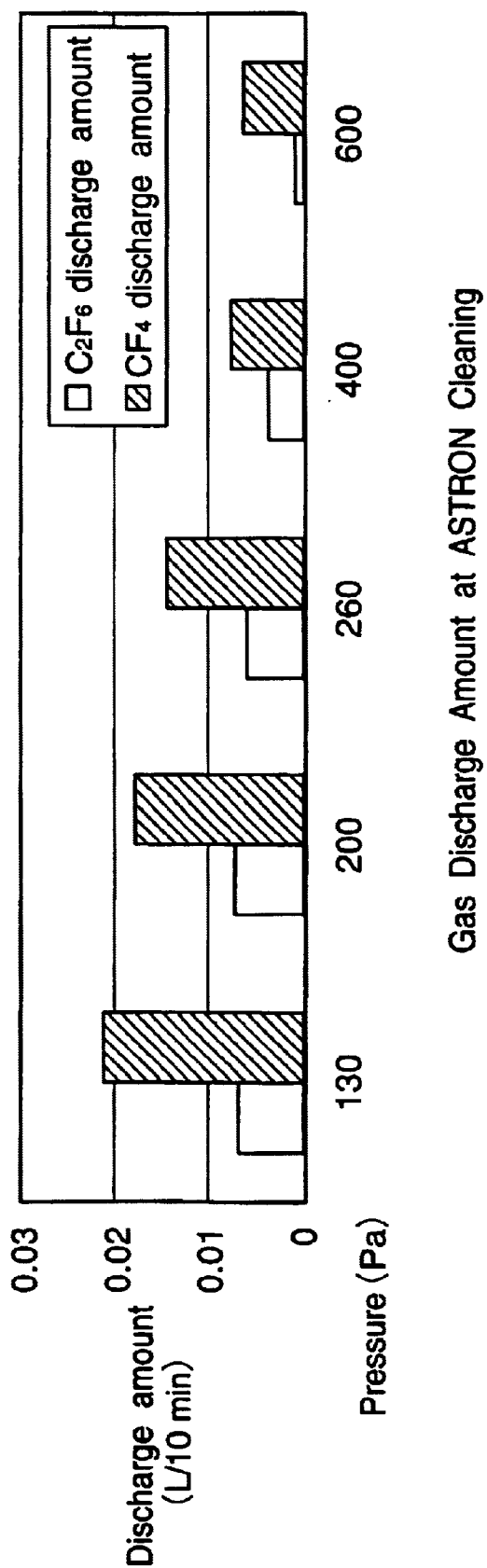
FIG. 7 is a graph showing the relationship between cleaning pressure and gas emission amount.

It is apparent from the results of FIG. 7 that the discharge amount of discharge gas resulting from cleaning can be lowered by increasing the pressure of cleaning gas during cleaning.

EXAMPLE 3

After each of various cleaning methods performed in the same manner as in the above Examples, long run film forming experiments were carried out under the same conditions as in Example 1 except that the pressure was 260 Pa. Further, as a comparative example, long run film forming experiments were also carried out in the case where no cleaning was performed.

After continuous film forming experiments, foreign matters (dirts) with a size of 1.01 μm or greater on the base material were inspected. The results are shown in the graph of FIG. 8.

Figure 8:
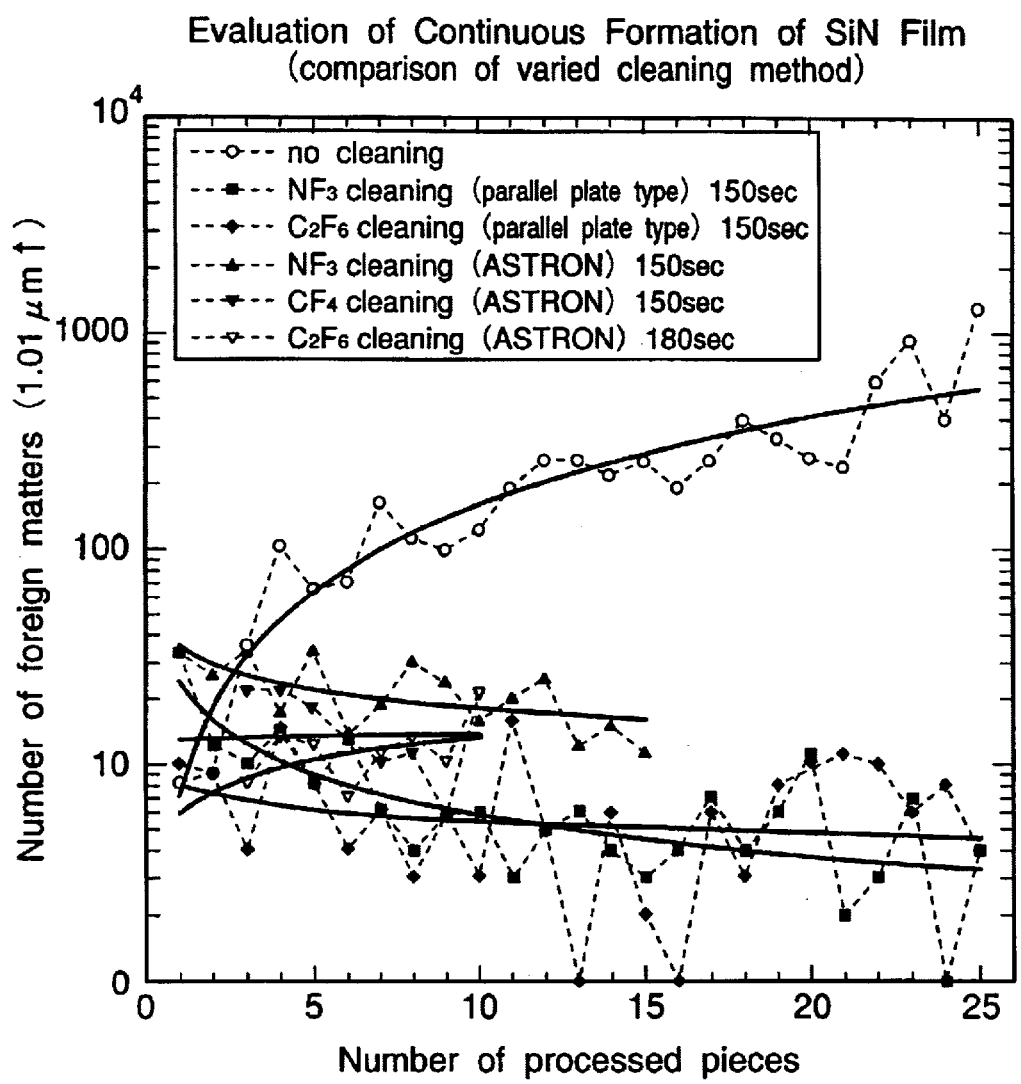
FIG. 8 is a graph showing the relationship between number of pieces having undergone film forming process and number of observed foreign matters with respect to varied cleaning methods.

As apparent from the graph of FIG. 8, with respect to the number of observed foreign matters as well, there is no marked difference between the remote plasma type cleaning method according to the present invention and the conventional parallel plate type plasma cleaning method.

In the present invention, the fluorinated cleaning gas containing a fluorocompound is converted to plasma by the remote plasma generator after the film formation. Then, the cleaning gas having been converted to plasma is introduced into the reaction chamber so that by-products adhered to inner parts of the reaction chamber is removed. Therefore, the dissociation efficiency of cleaning gas is so high that the by-products such as $SiO_2$ and $Si_3N_4$ adhered to and deposited on surfaces of the inner wall, electrodes and other parts of the reaction chamber can be removed efficiently. Moreover, by virtue of the construction, the discharge amount of cleaning gas is so small that the influence on environment such as global warming is little and cost reduction can be also attained.

Further, in the present invention, the cleaning gas having been converted to plasma by the remote plasma generator does not pass through the raw material supply path, upper electrode, etc. As a result, the cleaning gas having been converted to plasma would not impact and contact with wall parts of such members. Therefore, the efficiency of gasifying the by-products into $SiF_4$ by reacting the cleaning gas with by-products such as $SiO_2$ and $Si_3N_4$, which is adhered to and deposited on surfaces of the inner wall, electrodes and other parts of the reaction chamber, would be in no event lowered.

Still further, the cleaning gas for use in the present invention contains a fluorocompound. As for the fluorocompound, for example, nitrogenous fluorocompounds, oxygen-containing perfluorocarbons and perfluorocarbons having 1 to 6 carbon atoms can be used. When these fluorocompounds are used as the cleaning gas, the dissociation efficiency of cleaning gas is so high that the by-products such as $SiO_2$ and $Si_3N_4$ adhered to and deposited on surfaces of the inner wall, electrodes and other parts of the reaction chamber can be removed efficiently. Moreover, when these fluorocompounds are used as the cleaning gas, the discharge amount of cleaning gas is so small that the influence on environment such as global warming is little and cost reduction can be also attained. As apparent from the foregoing, the present invention can exert a variety of striking peculiar functions and effects.

What is claimed is:

1. A method of cleaning a CVD apparatus wherein a reactive gas is fed into a reaction chamber and a deposited film is formed on a surface of base material disposed in the reaction chamber, said method comprising:

converting a fluorinated cleaning gas containing a fluorocompound to plasma using a remote plasma generator after formation of the deposited film on the base material surface, and introducing the plasma cleaning gas into the reaction chamber to thereby remove any by-products sticking to inner parts of the reaction chamber, wherein:

the plasma cleaning gas is directly introduced into the reaction chamber; and the plasma cleaning gas is introduced into the reaction chamber through a raw-material gas supply path.

2. The cleaning method as claimed in claim 1, wherein a distance between the remote plasma generator and the reaction chamber is in a range of 0 to 200 cm.

3. The cleaning method as claimed in claim 1, wherein the plasma cleaning gas is introduced through a side part of the reaction chamber.

4. The cleaning method as claimed in claim 1, wherein a selective switching is performed between the direct introduction of the plasma cleaning gas into the reaction chamber and the introduction of the plasma cleaning gas into the reaction chamber through the raw gas supply path.

5. The cleaning method as claimed in claim 1, wherein the fluorocompound is at least one member selected from the group consisting of nitrogenous fluorocompounds, oxygen-containing perfluorocarbons and perfluorocarbons having 1 to 6 carbon atoms.

6. The cleaning method as claimed in claim 1, wherein the fluorocompound is a perfluorocarbon having 1 to 6 carbon atoms.

7. The cleaning method as claimed in claim 1, wherein the CVD apparatus is a plasma enhanced CVD apparatus having an upper electrode and a lower electrode both arranged inside a reaction chamber, between which a radiofrequency power is applied to thereby generate plasma, so that a deposited film is formed on a surface of base material disposed on the lower electrode inside the reaction chamber.

8. A cleaning device for a plasma CVD apparatus wherein a reactive gas is fed into a reaction chamber and a deposited film is formed on a surface of base material disposed in the reaction chamber, said cleaning device comprising:

a remote plasma generator capable of converting a fluorinated cleaning gas containing a fluorocompound to plasma after formation of the deposited film on the base material surface; and a cleaning gas introduction path for introducing the plasma cleaning gas into the reaction chamber, wherein by-products adhered to inner parts of the reaction chamber are removed by the plasma cleaning gas, and wherein the cleaning gas introduction path includes a first cleaning gas introduction path for directly introducing the plasma cleaning gas into the reaction chamber, and a second cleaning gas introduction path for introducing the plasma cleaning gas into the reaction chamber through a raw-material gas supply path.

9. The cleaning device as claimed in claim 8, wherein a distance between the remote plasma generator and the reaction chamber is in a range of 0 to 200 cm.

10. The cleaning device as claimed in claim 8, wherein the first cleaning gas introduction path is so constructed that the plasma cleaning gas is introduced through a side part of the reaction chamber.

11. The cleaning device as claimed in claim 8, further comprising a switching controller capable of performing a selective switching between the first cleaning gas introduction path and the second cleaning gas introduction path.

12. The cleaning device as claimed in claim 8, wherein the remote plasma generator is configured to convert to plasma a fluorocompound that includes at least one member selected from the group consisting of nitrogenous fluorocompounds, oxygen-containing perfluorocarbons and perfluorocarbons having 1 to 6 carbon atoms.

13. The cleaning device as claimed in claim 8, wherein the remote plasma generator is configured to convert to plasma a fluorocompound that is a perfluorocarbon having 1 to 6 carbon atoms.

14. The cleaning device as claimed in claim 8, wherein the cleaning device is configured to clean the plasma CVD apparatus having an upper electrode and a lower electrode both arranged inside a reaction chamber, the reaction chamber adapted to generate plasma upon application of a high frequency power between the upper electrode and the lower electrode to thereby form a deposited film on a surface of base material disposed on the lower electrode inside the reaction chamber.

* * * * *